United States Patent
Osawa et al.

(10) Patent No.: US 11,538,904 B2
(45) Date of Patent: Dec. 27, 2022

(54) SEMICONDUCTOR DEVICE

(71) Applicant: ROHM Co., LTD., Kyoto (JP)

(72) Inventors: Yuto Osawa, Kyoto (JP); Toshio Nakajima, Kyoto (JP); Shuta Kojima, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 43 days.

(21) Appl. No.: 17/032,224

(22) Filed: Sep. 25, 2020

(65) Prior Publication Data
US 2021/0098570 A1  Apr. 1, 2021

(30) Foreign Application Priority Data

Sep. 27, 2019  (JP) .............................. JP2019-177613

(51) Int. Cl.
*H01L 29/06* (2006.01)
*H01L 29/78* (2006.01)
*H01L 29/417* (2006.01)
*H01L 29/423* (2006.01)

(52) U.S. Cl.
CPC .... *H01L 29/0634* (2013.01); *H01L 29/41775* (2013.01); *H01L 29/4236* (2013.01); *H01L 29/7813* (2013.01)

(58) Field of Classification Search
CPC ............. H01L 29/0634; H01L 29/7813; H01L 29/41775; H01L 29/4236
See application file for complete search history.

(56) References Cited

U.S. PATENT DOCUMENTS 6,724,042 B2 *  4/2004  Onishi ................ H01L 29/0634
                                                       257/341
8,304,829 B2 * 11/2012  Yedinak .............. H01L 29/7811
                                                       257/334
8,450,800 B2 *  5/2013  Inomata .............. H01L 29/7813
                                                       257/335

(Continued)

FOREIGN PATENT DOCUMENTS

JP       2013084912 A      5/2013
JP         5754425 B2 *    7/2015  ......... H01L 29/0634
JP         5754425 B2      7/2015

OTHER PUBLICATIONS

JP-5754425-B2 machine translation (Year: 2021).*

*Primary Examiner* — Vincent Wall

(74) *Attorney, Agent, or Firm* — Chip Law Group

(57) ABSTRACT

Disclosed is a semiconductor device including a semiconductor layer having a main surface, a first conductivity type drift region formed at a surface layer part of the main surface, a super junction region having a first conductivity type first column region and a second conductivity type second column region, a second conductivity type low resistance region formed at the surface layer part of the drift region and having an impurity concentration in excess of that of the second column region, a region insulating layer formed on the main surface and covering the low resistance region such as to cause part of the low resistance region to be exposed, a first pad electrode formed on the region insulating layer such as to overlap with the low resistance region, and a second pad electrode formed on the main surface and electrically connected to the second column region and the low resistance region.

19 Claims, 10 Drawing Sheets

(56) References Cited

U.S. PATENT DOCUMENTS

| | | | |
|---|---|---|---|
| 8,716,811 B2* | 5/2014 | Mori | H01L 29/7811 |
| | | | 257/409 |
| 9,123,549 B2* | 9/2015 | Takahashi | H01L 29/407 |
| 9,478,621 B2* | 10/2016 | Akagi | H01L 29/0634 |
| 9,831,316 B2* | 11/2017 | Inoue | H01L 29/7811 |
| 9,972,713 B2* | 5/2018 | Eguchi | H01L 29/0634 |
| 10,411,126 B2* | 9/2019 | Riegler | H01L 29/0638 |
| 10,439,056 B2* | 10/2019 | Arai | H01L 29/1095 |
| 10,749,026 B2* | 8/2020 | Yoshida | H01L 29/7813 |
| 2018/0130874 A1* | 5/2018 | Takaoka | H01L 29/0634 |

* cited by examiner

SEMICONDUCTOR DEVICE

CROSS REFERENCE TO RELATED APPLICATIONS

This application claims priority benefit of Japanese Patent Application No. JP 2019-177613 filed in the Japan Patent Office on Sep. 27, 2019. Each of the above-referenced applications is hereby incorporated herein by reference in its entirety.

BACKGROUND

The present disclosure relates to a semiconductor device including a super junction (SJ) region.

Japanese Patent Laid-open No. 2013-84912 discloses a semiconductor device that includes a semiconductor substrate, an SJ region, a p-type layer, an n-type source region, an interlayer insulating layer, a gate electrode (first pad electrode), and a source electrode (second pad electrode). The SJ region includes n-type column regions and p-type column regions alternately formed at a surface layer part of the semiconductor substrate. The p-type layer is formed on the SJ region. The n-type source region is formed in the p-type layer. The interlayer insulating layer covers the p-type layer. The gate electrode covers the p-type layer, with the interlayer insulating layer therebetween. The source electrode is disposed on the semiconductor substrate and is electrically connected to the p-type column regions, the p-type layer, and the n-type source region.

SUMMARY

At the time of a reverse recovery operation of the semiconductor device, a reverse recovery current flows into the source electrode through the p-type layer. Moreover, that region of the p-type layer which is located beneath the gate electrode provides a relatively large current path for the reverse recovery current, but, on the other hand, has a relatively high resistance value. Therefore, as a result of the amount of heat generated by the p-type layer increasing due to the reverse recovery current, the breakdown endurance amount at the time of reverse recovery of the semiconductor device is lowered starting from that region of the semiconductor layer which is located beneath the gate electrode.

Thus, there is a need for a semiconductor device in which lowering in the breakdown endurance amount due to a reverse recovery current can be restrained.

In accordance with an embodiment of the present disclosure, there is provided a semiconductor device including a semiconductor layer having a main surface, a first conductivity type drift region formed at a surface layer part of the main surface, an SJ region having a first conductivity type first column region and a second conductivity type second column region formed alternately at a surface layer part of the drift region, a second conductivity type low resistance region formed at the surface layer part of the drift region and having an impurity concentration in excess of an impurity concentration of the second column region, a region insulating layer formed on the main surface and covering the low resistance layer such as to cause a part of the low resistance region to be exposed, a first pad electrode formed on the region insulating layer such as to overlap with the low resistance layer, and a second pad electrode formed on the main surface and electrically connected to the second column region and the low resistance region.

According to this semiconductor device, that region of the semiconductor layer which is located beneath the first pad electrode (region insulating layer) can be lowered in resistance. As a result, a temperature rise due to a reverse recovery current flowing in the region beneath the first pad electrode can be restrained. Therefore, a semiconductor device in which lowering in the breakdown endurance amount due to a reverse recovery current can be restrained can be provided.

In accordance with another embodiment of the present disclosure, there is provided a semiconductor device including a semiconductor layer having a main surface, a first conductivity type drift region formed at a surface layer part of the main surface, an SJ region having a first conductivity type first column region and a second conductivity type second column region formed alternately at a surface layer part of the drift region, a second conductivity type field limit (FL) region formed at the surface layer part of the drift region such as to surround the SJ region in plan view, a second conductivity type low resistance region that is formed in a region surrounded by the FL region at the surface layer part of the drift region and that has an impurity concentration in excess of an impurity concentration of the FL region, a region insulating layer formed on the main surface and covering the low resistance region such as to cause a part of the low resistance region to be exposed, a first pad electrode formed on the region insulating layer such as to overlap with the low resistance region, and a second pad electrode formed on the main surface and electrically connected to the second column region and the low resistance region.

According to this semiconductor device, that region of the semiconductor layer which is located beneath the first pad electrode (region insulating layer) can be lowered in resistance. As a result, a temperature rise due to a reverse recovery current flowing in the region beneath the first pad electrode can be restrained. Therefore, a semiconductor device in which lowering in the breakdown endurance amount due to a reverse recovery current can be restrained can be provided.

DETAILED DESCRIPTION OF THE PREFERRED EMBODIMENT

An embodiment of the present disclosure will be described in detail below, referring to the attached drawings.

Figure 1:
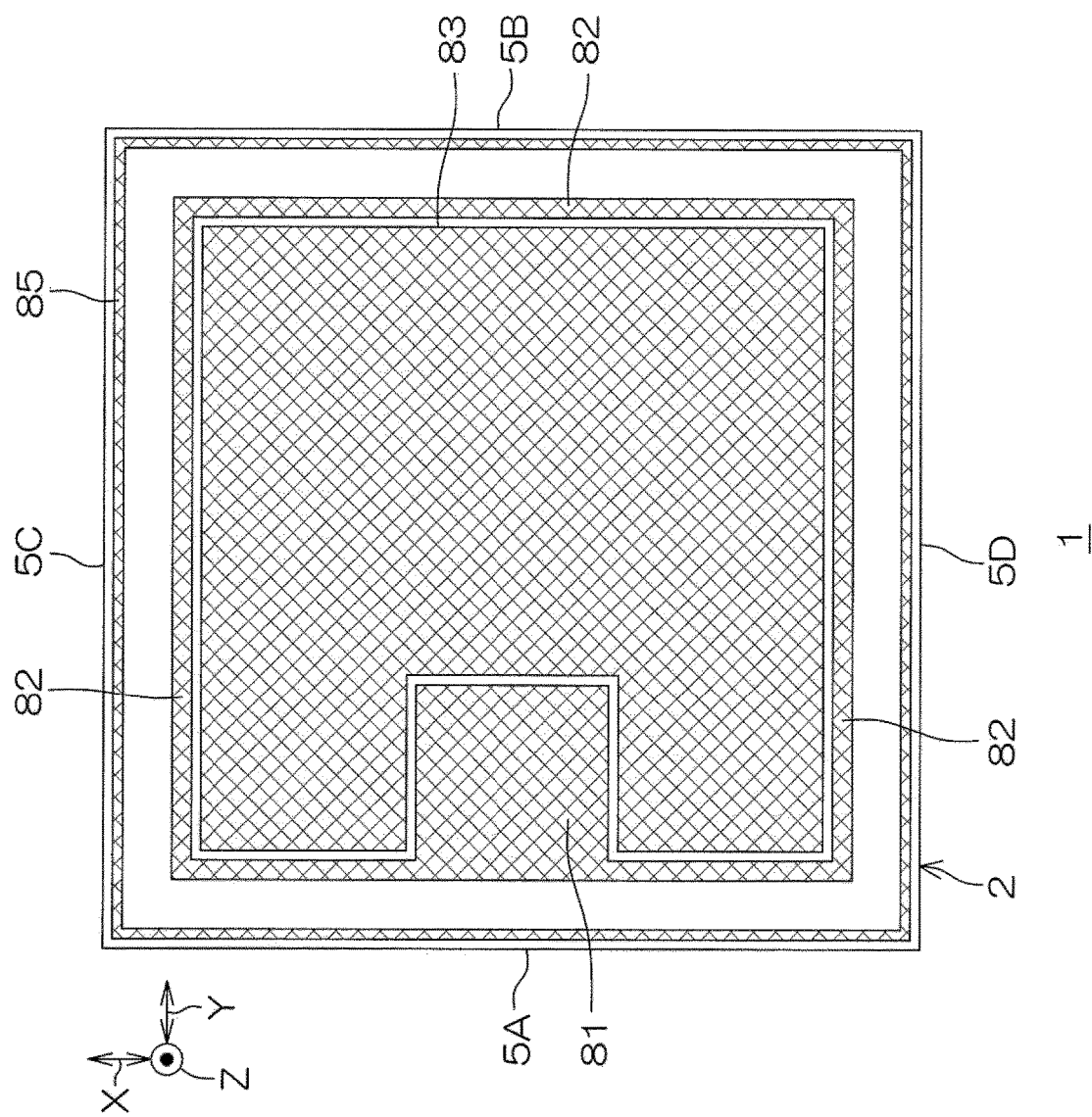
FIG. 1 is a plan view depicting a semiconductor device according to an embodiment of the present disclosure.
Figure 2:
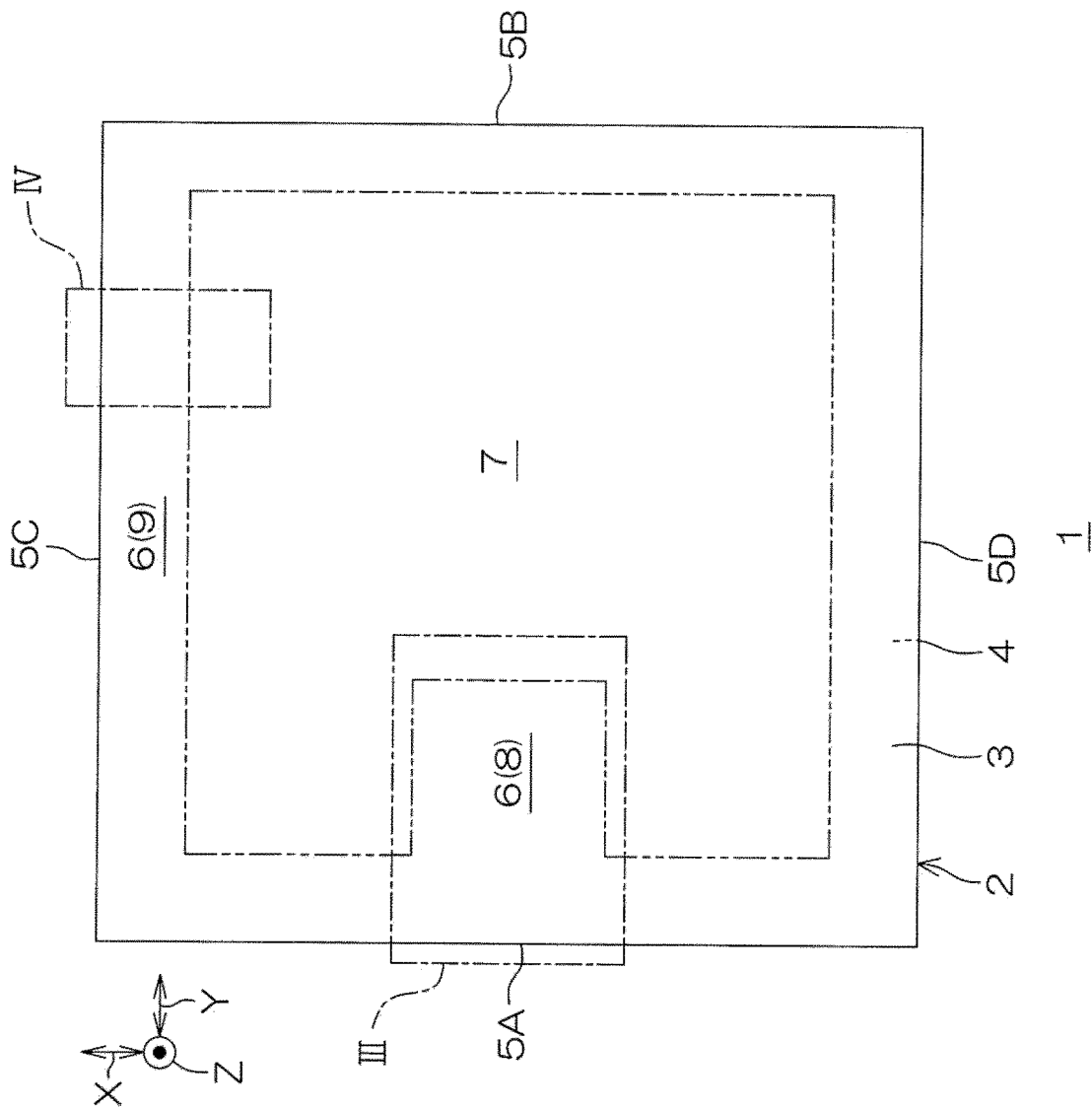
FIG. 2 is a plan view depicting the structure of a first main surface of a semiconductor layer illustrated in FIG. 1.
Figure 3:
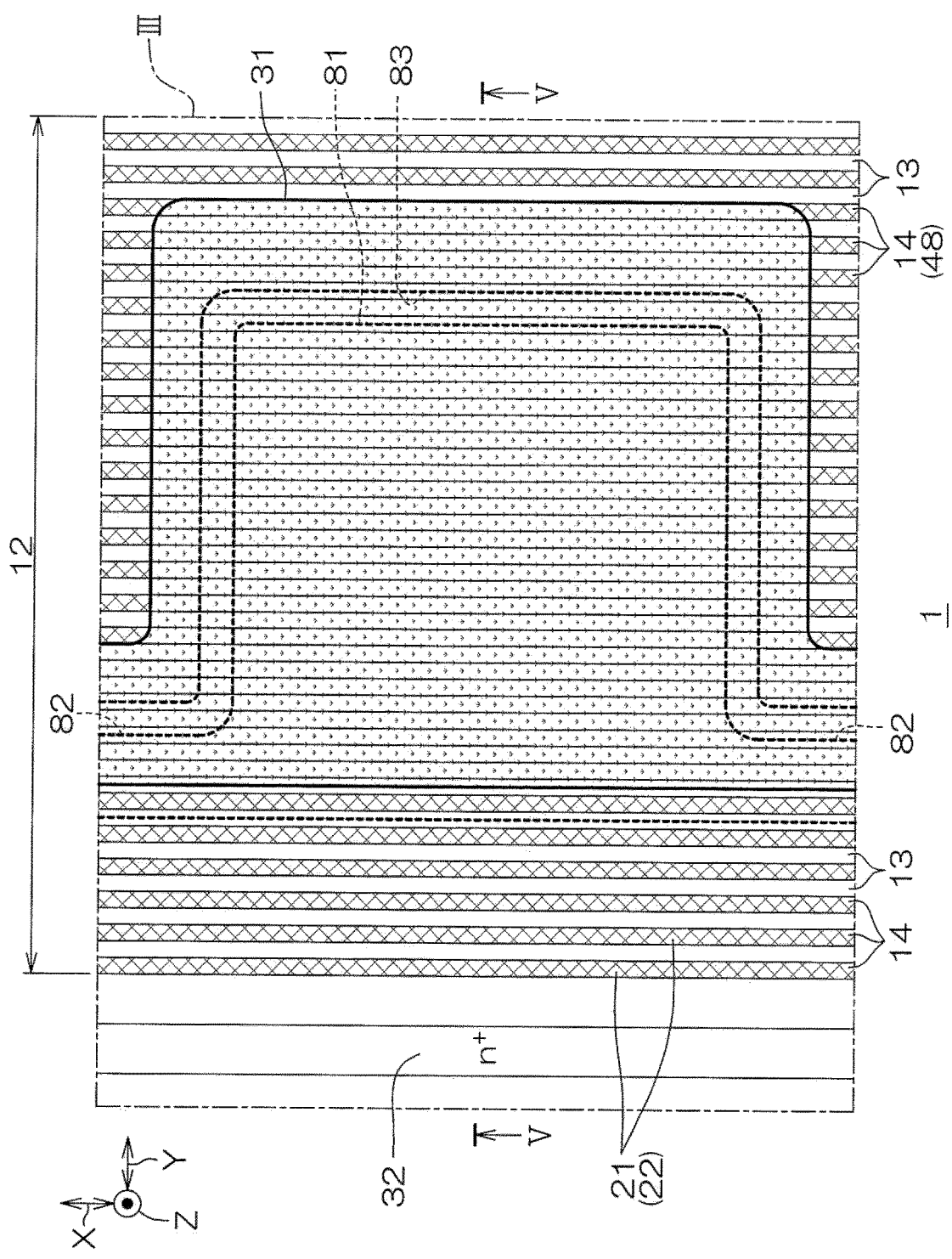
FIG. 3 is an enlarged view of region III illustrated in FIG. 2.
Figure 4:
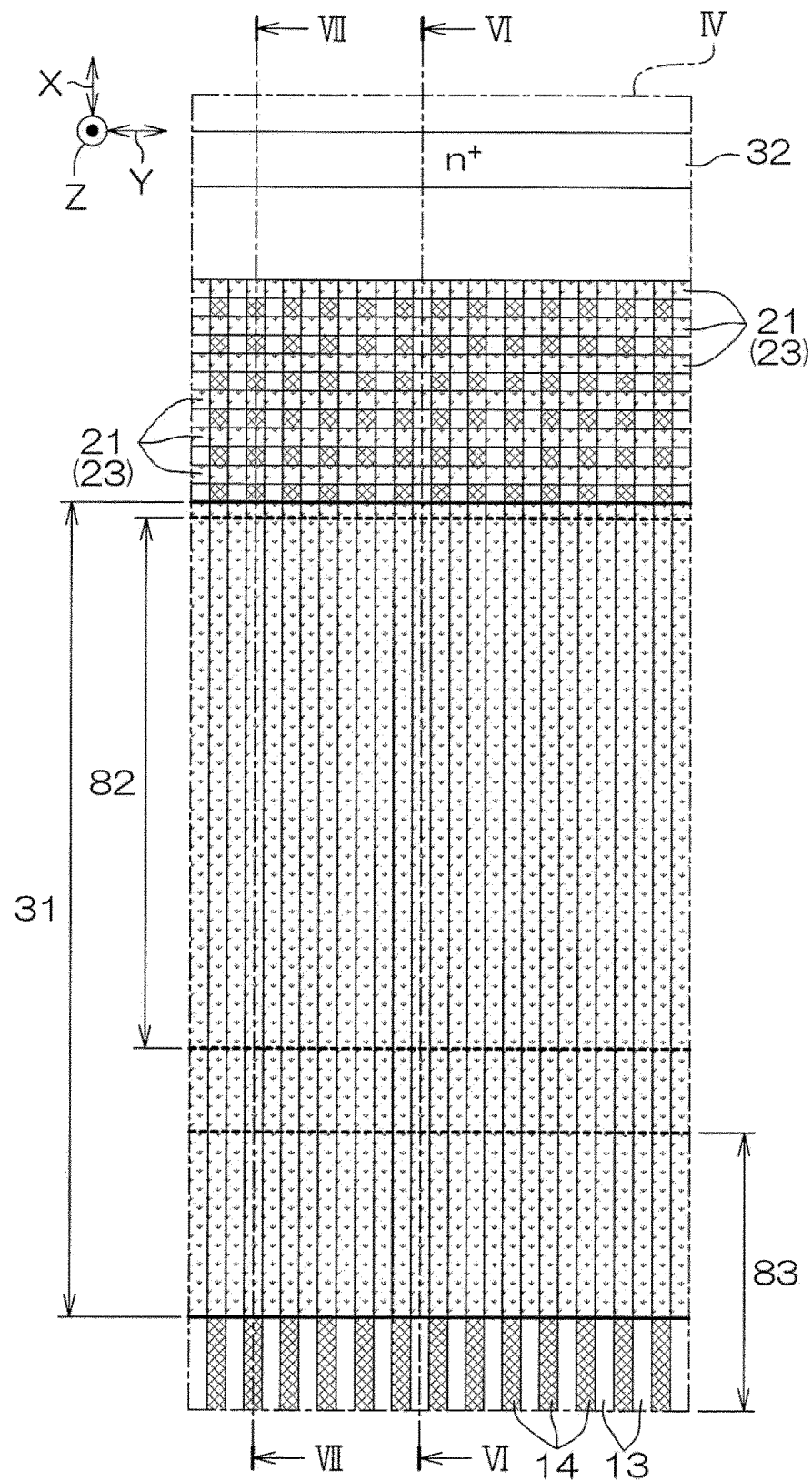
FIG. 4 is an enlarged view of region IV depicted in FIG. 2.
Figure 5:
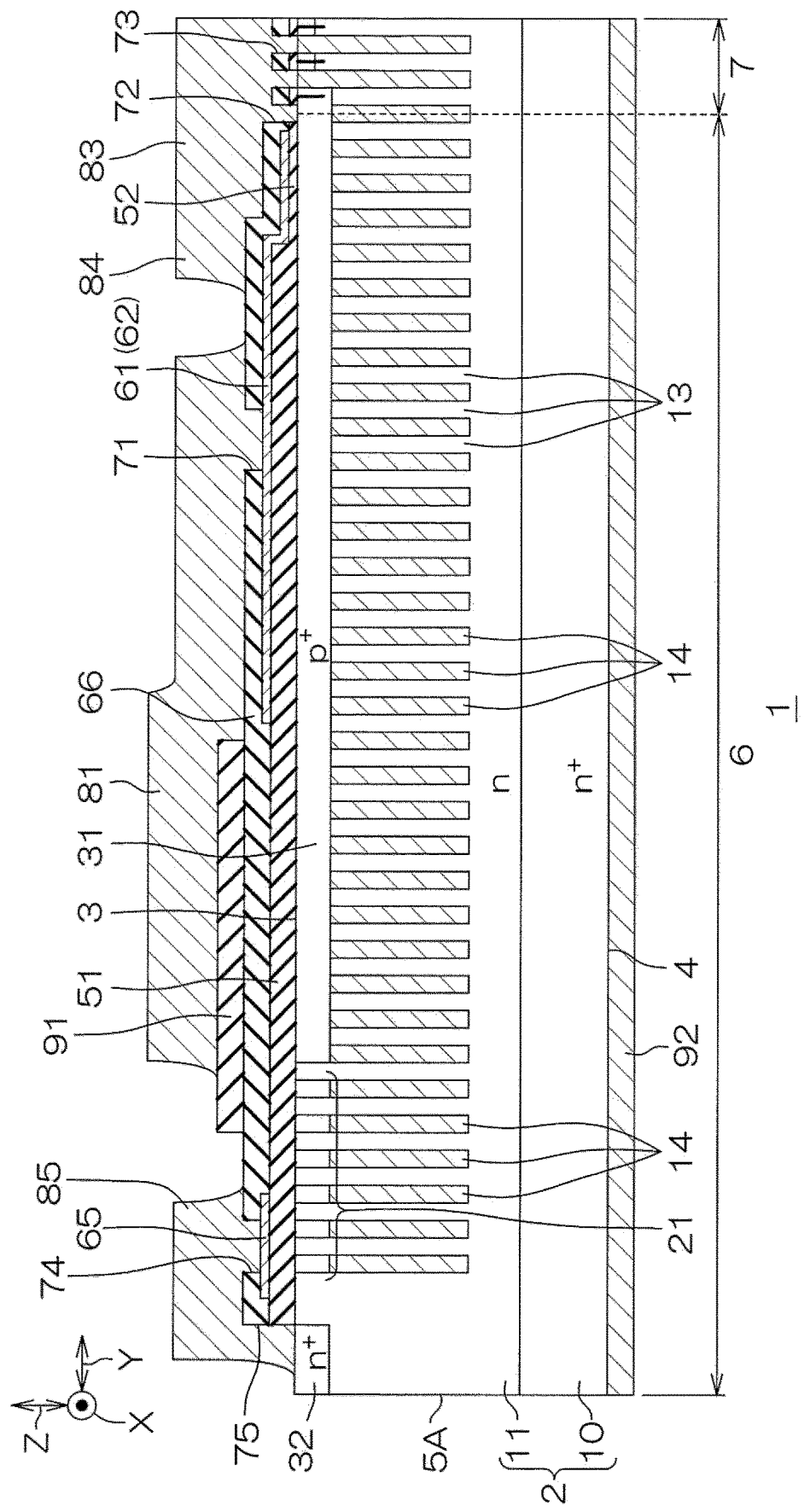
FIG. 5 is a sectional view taken along line V-V of FIG. 3.
Figure 6:
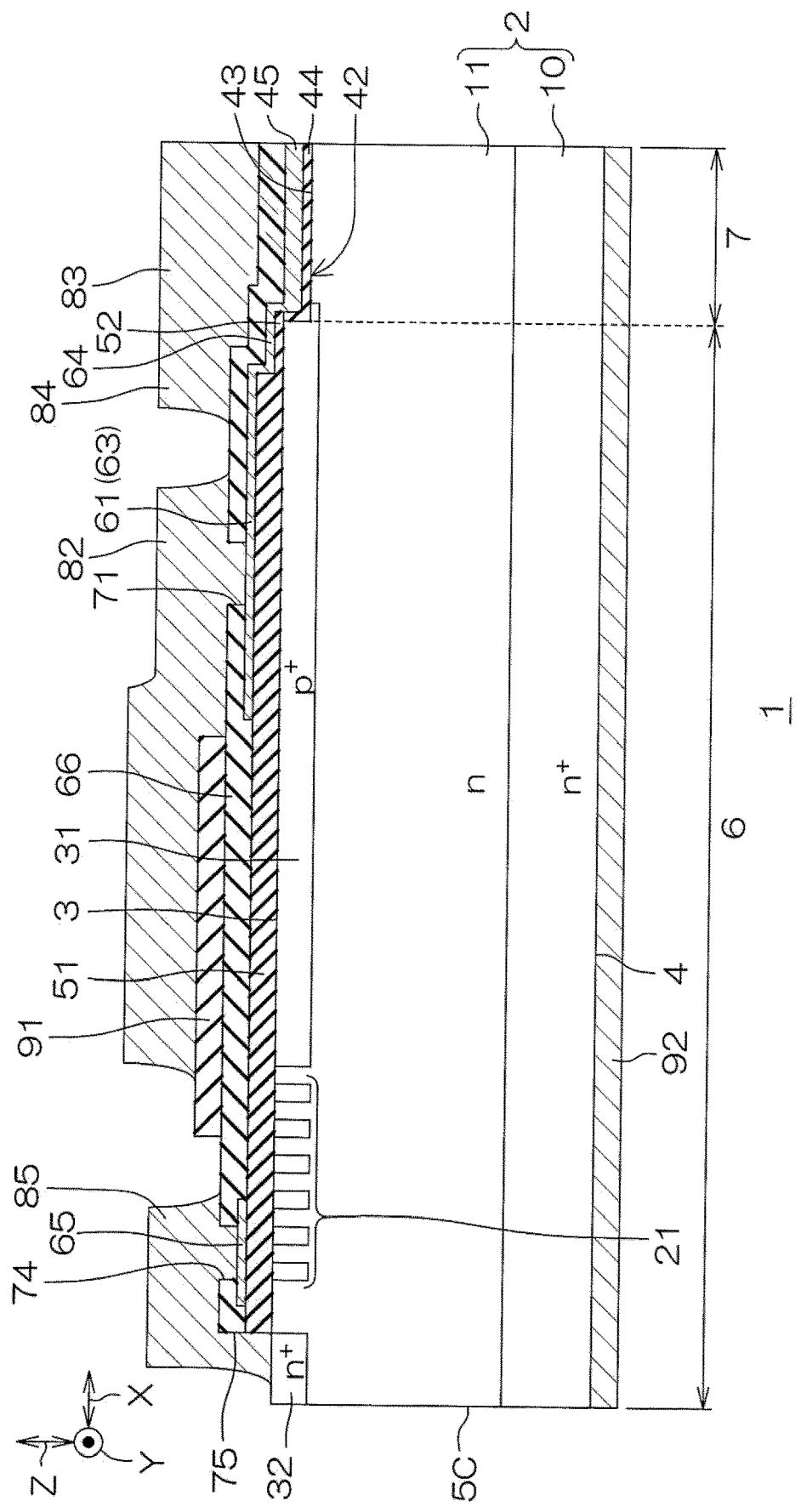
FIG. 6 is a sectional view taken along line VI-VI of FIG. 4.
Figure 7:
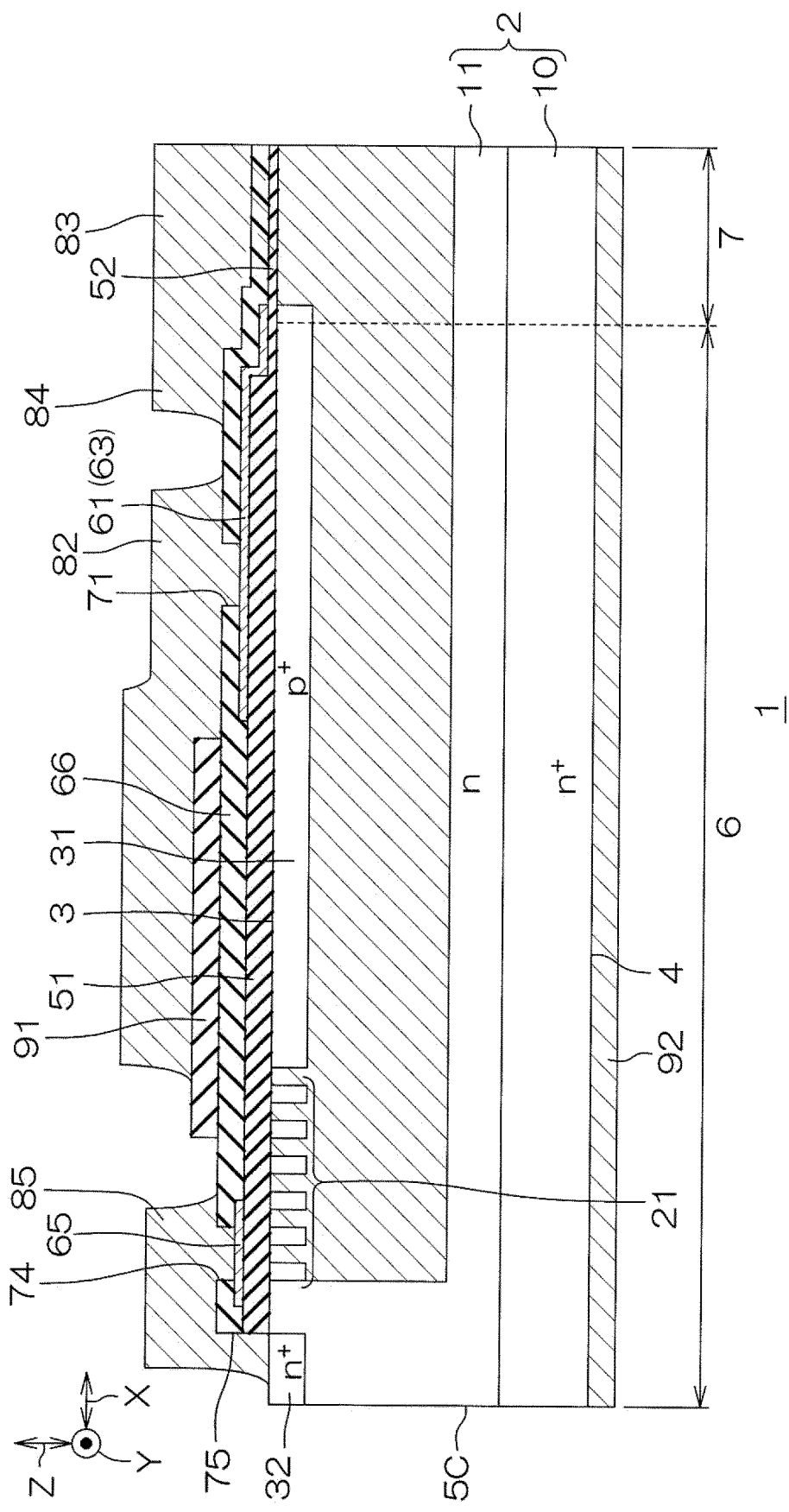
FIG. 7 is a sectional view taken along line VII-VII of FIG. 4.
Figure 8:
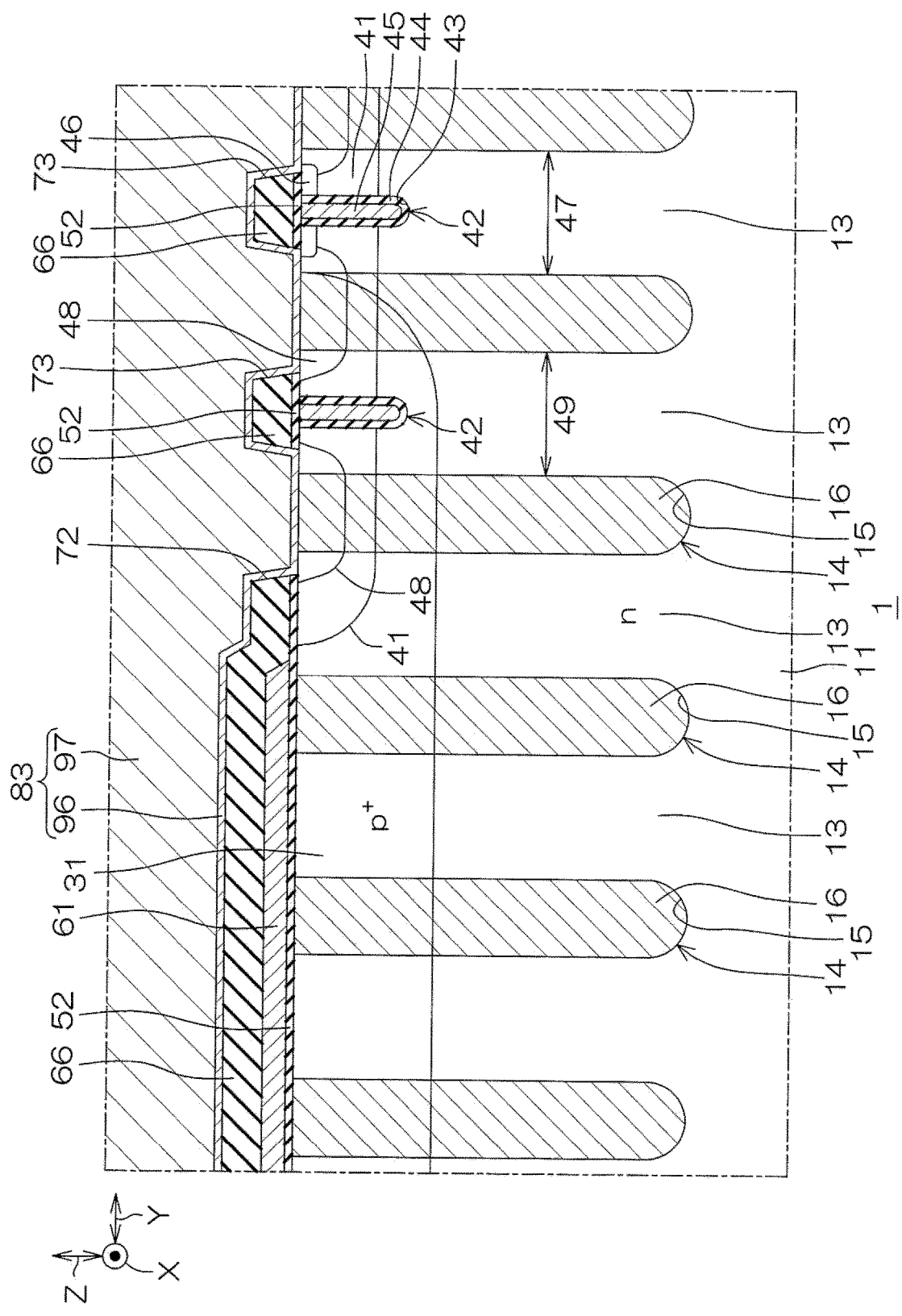
FIG. 8 is an enlarged view of a main part of FIG. 5.

FIG. 1 is a plan view depicting a semiconductor device 1 according to an embodiment of the present disclosure. FIG. 2 is a plan view depicting the structure of a first main surface 3 of a semiconductor layer 2 illustrated in FIG. 1. FIG. 3 is an enlarged view of region III depicted in FIG. 2. FIG. 4 is an enlarged view of region IV depicted in FIG. 2. FIG. 5 is a sectional view taken along line V-V of FIG. 3. FIG. 6 is a sectional view taken along line VI-VI of FIG. 4. FIG. 7 is a sectional view taken along line VII-VII of FIG. 4. FIG. 8 is an enlarged view of a main part of FIG. 5.

Referring to FIGS. 1 and 2, the semiconductor device 1 is a semiconductor switching device including a super junction-metal insulator semiconductor field effect transistor (SJ-MISFET). The SJ-MISFET may also be called a super junction-metal oxide semiconductor field effect transistor (SJ-MOSFET).

The semiconductor device 1 includes a silicon-made semiconductor layer 2 formed in a rectangular parallelepiped shape. The semiconductor layer 2 includes a first main surface 3 on one side, a second main surface 4 on the other side, and four side surfaces 5A, 5B, 5C and 5D connecting the first main surface 3 and the second main surface 4. The first main surface 3 and the second main surface 4 are respectively formed in a tetragonal shape in plan view as viewed from a normal direction Z thereof (hereinafter simply referred to as "in plan view"). The first main surface 3 may be a ground surface. The second main surface 4 may be a ground surface. The semiconductor device 1 includes a gate pad electrode 81 (first pad electrode), a gate finger electrode 82, a source pad electrode 83 (a second pad electrode), and an equipotential electrode 85.

The four side surfaces 5A to 5D include a first side surface 5A, a second side surface 5B, a third side surface 5C, and a fourth side surface 5D. The first side surface 5A and the second side surface 5B extend in a first direction X and are opposed to a second direction Y that intersects the first direction X. The third side surface 5C and the fourth side surface 5D extend in the second direction Y and are opposed to the first direction X. The second direction Y is, specifically, orthogonal to the first direction X.

Referring to FIG. 2, the semiconductor layer 2 includes an outside region 6 and a cell region 7. The outside region 6 is a region that is formed at a peripheral edge part of the semiconductor layer 2 and that is formed with a pressure resistant structure concerning the SJ-MISFET. The cell region 7 is a region in which a main part of the SJ-MISFET is formed and is partitioned by the outside region 6.

The outside region 6, specifically, includes a pad region 8 and a belt region 9. In this mode, the pad region 8 is formed at a part along a central part of the first side surface 5A in plan view. In this mode, the pad region 8 is formed in a tetragonal shape in plan view. The belt region 9 is formed in a belt shape extending along the first to fourth side surfaces 5A to 5D in plan view. Specifically, the belt region 9 is formed in an annular shape (in this mode, a tetragonal annular shape) extending along the first to fourth side surfaces 5A to 5D in plan view and partitions the inside of the semiconductor layer 2 from four directions. The cell region 7 is partitioned in a plan-view shape corresponding to the plan-view shape of the outside region 6, by the outside region 6.

The semiconductor device 1 includes an n$^+$-type drain region formed at a surface layer part of the second main surface 4 of the semiconductor layer 2. The drain region 10 is formed ranging over the whole region of the surface layer part of the second main surface 4 and forms the second main surface 4. In this mode, the drain region 10 includes an n$^+$-type semiconductor substrate. The n-type impurity concentration of the drain region 10 may be $1 \times 10^{18}$ to $1 \times 10^{21}$ cm$^{-3}$.

The thickness of the drain region 10 along the normal direction Z may be 50 to 400 μm. The thickness of the drain region 10 may be 50 to 100 μm, 100 to 200 μm, 200 to 300 μm, or 300 to 400 μm. The thickness of the drain region 10 is preferably equal to or more than 100 μm.

As illustrated in FIG. 5, the semiconductor device 1 includes an n-type drift region 11 formed at a surface layer part of the first main surface 3 of the semiconductor layer 2. The drift region 11 is formed ranging over the whole region of the surface layer part of the first main surface 3 and forms the first main surface 3. The drift region 11 is electrically connected to the drain region 10. The boundary between the drain region 10 and the drift region 11 extends in parallel to the first main surface 3.

In this mode, the drift region 11 includes an n-type epitaxial layer formed on the semiconductor substrate. The drift region 11 has an n-type impurity concentration less than the n-type impurity concentration of the drain region 10. The n-type impurity concentration of the drift region 11 may be $1.0 \times 10^{15}$ to $1.0 \times 10^{17}$ cm$^{-3}$.

The thickness of the drift region 11 along the normal direction Z is less than the thickness of the drain region 10. The thickness of the drift region 11 may be 10 to 50 μm. The thickness of the drift region 11 may be 10 to 15 μm, 15 to 20 μm, 20 to 30 μm, 30 to 40 μm, or 40 to 50 μm.

Referring to FIGS. 3 to 8, the semiconductor device 1 includes an SJ region 12 formed at a surface layer part of the drift region 11. In this mode, the SJ region 12 is formed uniformly ranging over the whole region of the surface layer part of the drift region 11. In other words, the SJ region 12 is formed uniformly ranging over the outside region 6 and the cell region 7.

The SJ region 12 includes a plurality of n-type first column regions 13 and a plurality of p$^-$-type second column regions 14 that are formed alternately at the surface layer part of the drift region 11. In FIGS. 3 to 8, the second column regions 14 are indicated by hatching. The plurality of first column regions 13 and the plurality of second column regions 14 are formed in a stripe shape in plan view.

The plurality of first column regions 13, specifically, are respectively formed in a belt shape extending along the first direction X in plan view and are formed spaced from one another in the second direction Y. The plurality of first column regions 13 each have one end part on one side, the other end part on the other side, and a belt part extending in a belt shape between the one end part and the other end part. The one end part of each first column region 13 is located in a region along the third side surface 5C in the outside region 6. The other end part of each first column region 13 is located in a region along the fourth side surface 5D in the outside region 6.

The n-type impurity concentration of each first column region 13 may be $1.0 \times 10^{15}$ to $1.0 \times 10^{17}$ cm$^{-3}$. In this mode, each first column region 13 is formed by using a part of the drift region 11. Each first column region 13 has the same n-type impurity concentration as the n-type impurity concentration of the drift region 11.

The width of each first column region 13 in the second direction Y may be 1 to 10 μm. The width of each first column region 13 in the second direction Y may be 1 to 2 μm, 2 to 4 μm, 4 to 6 μm, 6 to 8 μm, or 8 to 10 μm.

The plurality of second column regions 14, specifically, are respectively formed in a belt shape extending in the first direction X in plan view and are formed spaced from one another in the second direction Y. The plurality of second column regions 14 are formed alternately with the plurality of first column regions 13, in a manner of sandwiching one first column region 13 from both sides in the second direction Y.

The plurality of second column regions 14 each include one end part on one side, the other end part on the other side, and a belt part extending in a belt shape between the one end part and the other end part. The one end part of each second column region 14 is located in a region along the third side surface 5C in the outside region 6. The other end part of each second column region 14 is located in a region along the fourth side surface 5D in the outside region 6.

Each second column region 14 is shallower than the drift region 11. In other words, each second column region 14 has a bottom part located on the first main surface 3 side relative to a bottom part of the drift region 11. Each second column region 14 forms a pn junction between itself and the drift region 11. As a result, there is formed a pn junction diode that has the second column region 14 as an anode and has the drift region 11 as a cathode.

In this mode, each second column region 14 has a trench structure including a column trench 15 and p-type polysilicon 16. The column trench 15 is formed by digging the first main surface 3 toward the second main surface 4. The column trench 15 includes side walls and a bottom wall. The bottom wall of the column trench 15 is located on the first main surface 3 side relative to the bottom part of the drift region 11. The bottom wall of the column trench 15 may be formed in a curved surface shape directed toward the second main surface 4. The side walls and the bottom wall of the column trench 15 cause the drift region 11 to be exposed.

The p-type polysilicon 16 is embedded in the column trench 15 as an integral body. The p-type polysilicon has a polysilicon surface exposed from the column trench 15. The polysilicon surface is continuous with the first main surface 3. The polysilicon surface may be formed flush with the first main surface 3. The polysilicon surface may form a ground surface between itself and the first main surface 3.

The p-type impurity concentration of each second column region 14 (p-type polysilicon 16) may be $1.0 \times 10^{15}$ to $1.0 \times 10^{17}$ cm$^{-3}$. The width of each second column region 14 in the second direction Y may be 1 to 10 μm. The width of each second column region 14 in the second direction Y may be 1 to 2 μm, 2 to 4 μm, 4 to 6 μm, 6 to 8 μm, or 8 to 10 μm. The width of each second column region 14 in the second direction Y is preferably 1 to 7 μm.

The thickness of each second column region 14 along the normal direction Z (the depth of the column trench 15) is less than the thickness of the drift region 11. The thickness of each second column region 14 may be 10 to 40 μm. The thickness of each second column region may be 10 to 15 μm, 15 to 20 μm, 20 to 30 μm, or 30 to 40 μm. The thickness of each second column region 14 is preferably 10 to 20 μm.

The semiconductor device 1 includes a p-type FL region 21 formed in the outside region 6 at a surface layer part of the drift region 11. The p-type impurity concentration of the FL region 21 may be $1.0 \times 10^{16}$ to $1.0 \times 10^{13}$ cm−3. The p-type impurity concentration of the FL region 21 may exceed the p-type impurity concentration of the second column region 14.

Each FL region 21 has a thickness less than the thickness of the second column region 14. The thickness of each FL region 21 may be 1 to 10 μm. The thickness of each FL region 21 may be 1 to 2 μm, 2 to 4 μm, 4 to 6 μm, 6 to 8 μm, or 8 to 10 μm. The thickness of each FL region 21 is preferably 1 to 4 μm.

In this mode, an FL region group including a plurality of FL regions 21 is formed in the outside region 6. The plurality of FL regions 21 are formed in the belt region 9 of the outside region 6. One or a plurality of FL regions 21 passing through the pad region 8 of the outside region 6 may be formed. The plurality of FL regions 21 are formed in the outside region 6 in the state of being spaced in a direction of going away from the cell region 7. The number of the FL regions 21 is controlled according to an electric field to be relaxed. The number of the FL regions 21 may be 1 to 40.

The plurality of FL regions 21 are each formed in a belt shape extending along the outside region 6. Specifically, the plurality of FL regions 21 are each formed in an annular shape (in this mode, a tetragonal annular shape) extending along the outside region 6 in plan view. In other words, each FL region 21 is formed as a field limit ring (FLR) region. As a result, the plurality of FL regions 21 partition the cell region 7 from the four directions in plan view and surround the SJ region 12.

Referring to FIGS. 3 and 4, the plurality of FL regions each include a first region 22 extending along the first direction X and a second region 23 extending in the second direction Y. Each first region 22 overlaps with the second column region 14 in plan view and extends along the second column region 14. In other words, the plurality of FL regions 21 (first regions 22) are formed at a pitch equal to the pitch of the plurality of second column regions 14.

Each second region 23 extends such as to intersect (more specifically, to be orthogonal to) the plurality of first column regions 13 and the plurality of second column regions 14 in plan view. The p-type impurity concentration of that part of each FL region 21 which overlaps with the second column region 14 is in excess of the p-type impurity concentration of that part of each FL region 21 which overlaps with the first column region 13.

Referring to FIG. 3, the semiconductor device 1 includes a p$^+$-type low resistance region 31 formed at a surface layer part of the drift region 11 in the outside region 6. In FIG. 3, the low resistance region 31 is indicated by dot form hatching.

The p-type impurity concentration of the low resistance region 31 is in excess of the impurity concentration of the second column region 14. In addition, the p-type impurity concentration of the low resistance region 31 is in excess of the impurity concentration of the FL region 21. The p-type impurity concentration of the low resistance region 31 is preferably in excess of $1 \times 10^{17}$ cm$^{-3}$ but not more than $1 \times 10^{13}$ cm$^{-3}$. The p-type impurity concentration of the low resistance region 31 is particularly preferably equal to or more than $4 \times 10^{17}$ cm$^{-3}$.

The low resistance region 31 has a thickness less than the thickness of the second column region 14. The thickness of the low resistance region 31 may be 1 to 10 μm. The thickness of the low resistance region 31 may be 1 to 2 μm, 2 to 4 μm, 4 to 6 μm, 6 to 8 μm, or 8 to 10 μm. The thickness of the low resistance region 31 is preferably 1 to 4 μm. The thickness of the low resistance region 31 may be equal to the thickness of the FL region 21.

The low resistance region 31 is formed in that region of the outside region 6 which is surrounded by the FL region 21. Specifically, the low resistance region 31 is interposed in a region between the cell region 7 and the FL region 21. The low resistance region 31 overlaps with a partial region of the SJ region 12. In other words, the low resistance region 31 overlaps with the plurality of first column regions 13 and the plurality of second column regions 14.

The p-type impurity concentration of that part of the low resistance region 31 which overlaps with the second column region 14 is in excess of the p-type impurity concentration of that part of the low resistance region 31 which overlaps with the first column region 13. With such a mode, the low resistance region 31 decreases resistance component of the outside region 6. Specifically, the low resistance region 31 decreases the resistance component of a current path formed between the FL region 21 and the cell region 7. Further specifically, the low resistance region 31 is formed in the pad region 8 of the outside region 6 and decreases the resistance component of the pad region 8. In this mode, the low resistance region 31 is formed ranging over substantially the whole region of the pad region 8.

In this mode, the low resistance region 31 is drawn out from the pad region 8 to the belt region 9 and decreases the resistance component of the belt region 9. The low resistance region 31 is formed in a belt shape extending along the first to fourth side surfaces 5A to 5D in the belt region 9 and partitions the cell region 7 from the four directions. The low resistance region 31 may be formed in a belt shape extending along at least one of the first to fourth side surfaces 5A to 5D in the belt region 9 and may partition the cell region 7 from at least one direction.

The low resistance region 31 is drawn out from the outside region 6 into the cell region 7. As a result, the low resistance region 31 includes an outer peripheral edge part located in the outside region 6 and an inner peripheral edge part located in the cell region 7. The outer peripheral edge part of the low resistance region 31 is formed spaced from the FL region 21 toward the cell region 7 side. The inner peripheral edge part on the pad region 8 side of the low resistance region 31 is connected to the second column region 14 in the cell region 7. The inner peripheral edge part on the belt region 9 side of the low resistance region 31 is connected to the first column regions 13 and the second column regions 14 in the cell region 7.

The semiconductor device 1 includes an n$^+$-type channel stop region 32 formed at an outermost periphery of the outside region 6 in a surface layer part of the drift region 11. The channel stop region 32 is formed in a region between the first to fourth side surfaces 5A to 5D and the FL region 21, in a state of being spaced from the FL region 21.

The channel stop region 32 extends in a belt shape along the first to fourth side surfaces 5A to 5D in plan view. Specifically, the channel stop region 32 is formed in an annular shape (in this mode, a tetragonal annular shape) extending along the first to fourth side surfaces 5A to 5D in plan view. The channel stop region 32 restrains a depletion layer extending from the cell region 7 from reaching the first to fourth side surfaces 5A to 5D. The channel stop region 32 may be exposed from the first to fourth side surfaces 5A to 5D.

Referring to FIG. 8, the semiconductor device 1 includes a p-type channel region 41 formed at a surface layer part of the first main surface 3 in the cell region 7. The channel region 41 is also called a body region. The channel region 41 is formed ranging over the whole region of the cell region 7 and forms a main body of the cell region 7. A peripheral edge of the channel region 41 is connected to an inner peripheral edge part of the low resistance region 31.

As a result, the channel region 41 overlaps with a partial region of the SJ region 12 in plan view. Specifically, the channel region 41 overlaps with the first column regions 13 and the second column regions 14 in plan view.

The channel region 41 has a p-type impurity concentration in excess of the p-type impurity concentration of the second column region 14. The p-type impurity concentration of the channel region 41 is less than the p-type impurity concentration of the low resistance region 31. The p-type impurity concentration of the channel region 41 may be $1.0 \times 10^{16}$ to $1.0 \times 10^{17}$ cm$^{-3}$.

The semiconductor device 1 includes a plurality of trench gate structures 42 formed at the first main surface 3 in the cell region 7. The plurality of trench gate structures 42 are formed respectively in the plurality of first column regions 13. As a result, the plurality of trench gate structures 42 are formed in the plurality of first column regions 13 in a manner of sandwiching one second column region 14 from both sides in the second direction Y.

The plurality of trench gate structures 42 are each formed in a belt shape extending along the first direction X in plan view. The plurality of trench gate structures 42 are formed in a stripe pattern extending along the second direction Y in plan view. Each trench gate structure 42 includes a gate trench 43, a gate insulating layer 44, and a gate electrode 45.

The gate trench 43 is formed by digging the first main surface 3 down to the second main surface 4. The gate trench 43 penetrates the channel region 41, reaching the drift region 11. The gate trench 43 includes side walls and a bottom wall. The side walls of the gate trench 43 cause the channel region 41 and the drift region 11 to be exposed. The bottom wall of the gate trench 43 is located on the first main surface 3 side relative to a bottom part of the second column region 14 (a bottom wall of the column trench 15) and causes the drift region 11 to be exposed.

The gate trench 43 has a width less than the width of the second column region 14 (the width of the column trench 15). The width of the gate trench 43 may be 0.1 to 1 μm. The width of the gate trench 43 may be 0.1 to 0.2 μm, 0.2 to 0.4 μm, 0.4 to 0.6 μm, 0.6 to 0.8 μm, or 0.8 to 1 μm. The width of the gate trench 43 is preferably 0.15 to 0.5 μm.

The gate trench 43 has a depth less than the thickness of the second column region 14 (the depth of the column trench 15). The depth of the gate trench 43 may be 0.1 to 5 μm. The depth of the gate trench 43 may be 0.1 to 1 μm, 1 to 2 μm, 2 to 3 μm, 3 to 4 μm, or 4 to 5 μm. The depth of the gate trench 43 is preferably 0.5 to 3 μm.

The gate insulating layer 44 is formed in a film shape along an inner wall of the gate trench 43. The gate insulating layer 44 partitions a recess space in the gate trench 43. The gate insulating layer 44 may have a thickness of 100 to 200 nm.

The gate insulating layer 44 may include at least one of an SiO$_2$ layer, an SiN layer, an SiON layer, an AlO layer, an HfSiO layer, and an HfSiON layer. The gate insulating layer 44 may have a monolayer structure of an SiO$_2$ layer, an SiN layer, an AlO layer, an SiON layer, an HfSiO layer, or an HfSiON layer. The gate insulating layer 44 may have a stacked structure in which at least two layers of an SiO$_2$ layer, an SiN layer, an AlO layer, an SiON layer, an HfSiO layer, and an HfSiON layer are stacked in a freely-selected order. In this mode, the gate insulating layer 44 has a monolayer structure of an SiO$_2$ layer.

The gate electrode 45 is embedded in the gate trench 43, with the gate insulating layer 44 therebetween. Specifically, the gate electrode 45 is embedded in the recess space partitioned in the gate trench 43 by the gate insulating layer 44. The gate electrode 45 includes p-type polysilicon or n-type polysilicon. In this mode, the gate electrode 45 includes n-type polysilicon.

The semiconductor device 1 includes a plurality of n$^+$-type source regions 46 formed at a surface layer part of the channel region 41. The n-type impurity concentration of the source regions 46 is in excess of the n-type impurity concentration of the drift region 11. The n-type impurity concentration of the source regions 46 may be $1\times10^{19}$ to $1\times10^{20}$ cm$^{-3}$.

The plurality of source regions 46 are formed respectively in those regions of the surface layer part of the channel region 41 which are along the plurality of gate trenches 43. A bottom part of each source region 46 is located in a region on the first main surface 3 side relative to a bottom part of the channel region 41. Each source region 46 is formed with a space from the second column region 14 to the gate trench 43 side. Each source region 46 covers a side wall of the gate trench 43 and faces the gate electrode 45, with the gate insulating layer 44 therebetween.

Each source region 46 defines a channel of the SJ-MISFET between itself and the drift region 11 in the channel region 41. The channel is formed in that region of the channel region 41 which is along the gate insulating layer 44. In this way, a field effect transistor (FET) structure 47 including the channel region 41, the trench gate structure 42, and the source region 46 is formed in the region between the adjacent ones of the plurality of second column regions 14 in the cell region 7.

The semiconductor device 1 includes a plurality of p$^+$-type contact regions 48 formed at a surface layer part of the first main surface 3 in the cell region 7. The contact region 48 is also called an in-base region. The contact region 48 has a p-type impurity concentration in excess of the p-type impurity concentration of the second column region 14. The p-type impurity concentration of the contact region 48 is in excess of the p-type impurity concentration of the channel region 41. The p-type impurity concentration of the contact region 48 is in excess of the p-type impurity concentration of the low resistance region 31. The p-type impurity concentration of the contact region 48 may be $1\times10^{19}$ to $1\times10^{21}$ cm$^{-3}$.

Each contact region 48 is formed on a lateral side of the gate trench 43, with a space from the gate trench 43 in the first main surface 3 to the second column region 14 side. Specifically, each contact region 48 is formed such as to overlap with each second column region 14 and is formed in a belt shape extending along each second column region 14.

Each contact region 48 is formed to be wider than each second column region 14. Each contact region 48 includes a covering part that covers each second column region 14 and an exposed part that is exposed from each second column region 14. The exposed part of each contact region 48 is connected to each source region 46.

Referring to FIG. 8, the semiconductor device 1 includes a dummy FET structure 49 formed in that region of the cell region 7 which is close to an inner peripheral edge part of the low resistance region 31. The dummy FET structure 49 is similar in structure to the FET structure 47, except for not including the source region 46. The dummy FET structure 49 restrains formation of an npn-type parasitic bipolar transistor in a region close to the low resistance region 31. As a result, a current flowing in the low resistance region 31 can be restrained from being amplified by a parasitic bipolar transistor.

The dummy FET structure 49 is preferably covered by an inner peripheral edge part of the low resistance region 31. As a result, formation of an npn-type parasitic bipolar transistor at the inner peripheral edge part of the low resistance region 31 can be restrained suitably. It is natural that the dummy FET structure 49 may be formed spaced from the inner peripheral edge part of the low resistance region 31.

Referring to FIGS. 5 to 7, the semiconductor device 1 includes a region insulating layer 51 covering the first main surface 3 in the outside region 6. The region insulating layer 51 covers substantially the whole region of the outside region 6 (the pad region 8 and the belt region 9) and causes the cell region 7 to be exposed. In other words, that part of the region insulating layer 51 which covers the pad region 8 is formed in a tetragonal shape in plan view. In addition, that part of the region insulating region 51 which covers the belt region 9 is formed in a belt shape extending along the first to fourth side surfaces 5A to 5D and partitions the cell region 7 from the four directions.

The region insulating layer 51 covers the SJ region 12 and the low resistance region 31 in the outside region 6. Specifically, the region insulating layer 51 covers the plurality of first column regions 13, the plurality of second column regions 14, the low resistance region 31, and the plurality of FL regions 21 in the outside region 6. The region insulating layer 51 causes a part (inner peripheral edge part) of the low resistance region 31 to be exposed.

The region insulating layer 51 may have a monolayer structure or a stacked structure including either one of or both an SiO$_2$ layer and an SiN layer. The region insulating layer 51 may have a stacked structure including a plurality of SiO$_2$ layers. The region insulating layer 51 may include at least one of an undoped silicate glass (USG) layer, a phosphor silicate glass (PSG) layer, and a boron phosphor silicate glass (BPSG) layer, as an example of the SiO$_2$ layer.

The region insulating layer 51 may have a thickness of 1 to 10 μm. The thickness of the region insulating layer 51 may be 1 to 2 μm, 2 to 4 μm, 4 to 6 μm, 6 to 8 μm, or 8 to 10 μm. The thickness of the region insulating layer 51 is preferably 2 to 5 μm. The thickness of the region insulating layer 51 is preferably in excess of the thickness of the gate insulating layer 44.

Referring to FIGS. 5 to 7, the semiconductor device 1 includes a main surface insulating layer 52 that covers the first main surface 3 in the cell region 7. The main surface insulating layer 52 is continuous with the gate insulating layer 44 exposed from the gate trench 43. The main surface insulating layer 52 is drawn out from the cell region 7 into the outside region 6 and is continuous with the region insulating layer 51. The main surface insulating layer 52 covers an inner peripheral edge part of the low resistance region 31. The main surface insulating layer 52 has a thickness less than the thickness of the region insulating layer 51. The main surface insulating layer 52 may have a thickness of 100 to 200 nm.

Referring to FIGS. 5 to 7, the semiconductor device 1 includes a gate wiring layer 61 formed on the region insulating layer 51 in the outside region 6. The gate wiring layer 61 includes p-type polysilicon or n-type polysilicon. In this mode, the gate wiring layer 61 includes n-type polysilicon. The gate wiring layer 61 is selectively drawn around on the region insulating layer 51 and transmits a gate signal to the gate electrode 45.

The gate wiring layer 61 is formed with a space from the FL region 21 to the cell region 7 side in plan view. In other words, the gate wiring layer 61 does not face the FL region 21 with the region insulating layer 51 therebetween. The gate wiring layer 61 faces the low resistance region 31 with the region insulating layer 51 therebetween. The whole region of the gate wiring layer 61 may face the low resistance region 31 with the region insulating layer 51 therebetween.

The gate wiring layer 61 is drawn out from a position on the region insulating layer 51 onto the main surface insulating layer 52. As a result, the gate wiring layer 61 faces the plurality of first column regions 13, the plurality of second column regions 14, and the low resistance region 31, with the main surface insulating layer 52 therebetween.

Specifically, the gate wiring layer 61 includes a pad wiring part 62 and a belt wiring part 63. The pad wiring part 62 is formed on that part of the region insulating layer 51 (the main surface insulating layer 52) which covers the pad region 8. The pad wiring part 62 faces the plurality of first column region 13, the plurality of second column region 14, and the low resistance region 31, with the region insulating layer 51 (the main surface insulating layer 52) therebetween.

The belt wiring part 63 is drawn out from the pad wiring part 62 onto that part of the region insulating layer 51 (the main surface insulating layer 52) which covers the belt region 9. In this mode, the belt wiring part 63 is formed in a belt shape extending along the first to fourth side surfaces 5A to 5D and partitions the cell region 7 from the four directions. The belt wiring part 63 may be formed in a belt shape extending along at least two of the first to fourth side surfaces 5A to 5D and may partition the cell region 7 from at least two directions.

The belt wiring part 63 may have a width less than the width of the pad wiring part 62. The belt wiring part 63 faces the plurality of first column regions 13, the plurality of second column regions 14, and the low resistance region 31, with the region insulating layer 51 (the main surface insulating layer 52) therebetween.

That part of the belt wiring part 63 which extends along the third side surface 5C (the fourth side surface 5D) intersects (specifically, orthogonally intersects) the plurality of first column regions 13 and the plurality of second column regions 14 in plan view. That part of the belt wiring part 63 which extends along the third side surface 5C (the fourth side surface 5D) includes a draw-out part 64 drawn out from a position on the main surface insulating layer 52 toward the trench gate structure 42 (see FIG. 6). The draw-out part 64 of the gate wiring layer 61 is connected to the gate electrode 45.

Referring to FIGS. 5 to 7, the semiconductor device 1 includes an equipotential wiring layer 65 formed on the region insulating layer 51 in the outside region 6. The equipotential wiring layer 65 includes p-type polysilicon or n-type polysilicon. In this mode, the equipotential wiring layer 65 includes n-type polysilicon. The equipotential wiring layer 65 is formed with a space from the gate wiring layer to the first to fourth side surfaces 5A to 5D side. In this mode, the equipotential wiring layer 65 is formed on an outer peripheral edge part of the region insulating layer 51.

The equipotential wiring layer 65 is formed in a belt shape extending along the first to fourth side surfaces 5A to 5D. Specifically, the equipotential wiring layer 65 is formed in an annular shape (in this mode, a tetragonal annular shape) extending along the first to fourth side surfaces 5A to 5D in plan view. The equipotential wiring layer 65 is formed spaced to the first to fourth side surfaces 5A to 5D side from the low resistance region 31 in plan view. The equipotential wiring layer 65 faces the SJ region 12, with the region insulating layer 51 therebetween. The equipotential wiring layer 65 may face one or a plurality of FL regions 21 with the region insulating layer 51 therebetween.

Referring to FIGS. 5 to 9, the semiconductor device 1 includes an intermediate insulating layer 66 formed on the first main surface 3. The intermediate insulating layer 66 covers the region insulating layer 51 in the outside region 6 and covers the main surface insulating layer 52 in the cell region 7. The intermediate insulating layer 66 covers the gate wiring layer 61 and the equipotential wiring layer 65 in the outside region 6.

The intermediate insulating layer 66 may have a monolayer structure or a stacked structure including either one of or both an $SiO_2$ layer and an SiN layer. The intermediate insulating layer 66 may have a stacked structure including a plurality of $SiO_2$ layers. The intermediate insulating layer 66 may include at least one of a USG layer, a PSG layer, and a BPSG layer, as an example of the $SiO_2$ layer. In this mode, the intermediate insulating layer 66 has a monolayer structure of an $SiO_2$ layer.

The intermediate insulating layer 66 may have a thickness of 0.1 to 5 μm. The thickness of the intermediate insulating layer 66 may be 0.1 to 1 μm, 1 to 2 μm, 2 to 3 μm, 3 to 4 μm, or 4 to 5 μm. The thickness of the intermediate insulating layer 66 is preferably 1 to 3 μm. The thickness of the intermediate insulating layer 66 is preferably in excess of the thickness of the main surface insulating layer 52. The thickness of the intermediate insulating layer 66 may be less than the thickness of the region insulating layer 51.

The intermediate insulating layer 66 includes a first opening 71, a second opening 72, a third opening 73, a fourth opening 74, and a fifth opening 75. The number and shapes of the first opening 71, the second opening 72, the third opening 73, the fourth opening 74, and the fifth opening 75 can freely be selected.

The first opening 71 causes the gate wiring layer 61 to be exposed. The second opening 72 causes an inner peripheral edge part of the low resistance region 31 to be exposed. More specifically, the second opening 72 causes the inner peripheral edge part of the low resistance region 31, the second column regions 14, and the contact region 48 to be exposed. In this mode, the second opening 72 causes the channel region 41 to be exposed as well.

A plurality of the third openings 73 are formed in the cell region 7. Each of the third openings 73 causes the corresponding second column region 14, source region 46, and contact region 48 in the cell region 7 to be exposed. The fourth opening 74 causes the channel stop region 32 to be exposed. In this mode, the fourth opening 74 communicates with the first to fourth side surfaces 5A to 5D. The fifth opening 75 causes the equipotential wiring layer 65 to be exposed.

The semiconductor device 1 includes the gate pad electrode 81 (the first pad electrode) and the gate finger electrode 82 which are formed on the intermediate insulating layer 66 in the outside region 6. The gate pad electrode 81 functions as an external terminal to which a lead wire (for example, a bonding wire) is to be connected.

The gate pad electrode 81 is formed on that part of the intermediate insulating layer 66 which covers the pad region 8. The gate pad electrode 81 covers the whole region of the pad region 8 in plan view. In this mode, the pad region 8 is defined by that region of the outside region 6 which faces the gate pad electrode 81. The gate pad electrode 81 may be formed in a tetragonal shape in plan view.

The gate pad electrode 81 faces a part of the SJ region 12, with the intermediate insulating layer 66 therebetween. In short, the gate pad electrode 81 faces the plurality of first column regions 13 and the plurality of second column regions 14. In addition, the gate pad electrode 81 faces the low resistance region 31, with the intermediate insulating layer 66 therebetween. The gate pad electrode 81 is formed with a space from the channel stop region 32 to the cell region 7 side in plan view. The gate pad electrode 81 may face one or a plurality of FL regions 21, with the intermediate insulating layer 66 therebetween.

The gate pad electrode 81 enters into the first opening 71 from a position on the intermediate insulating layer 66. The gate pad electrode 81 is electrically connected to the gate wiring layer 61 in the first opening 71.

The gate finger electrode 82 is drawn out from the gate pad electrode 81 onto that part of the intermediate insulating layer 66 which covers the belt region 9. The gate finger electrode 82 extends in a belt shape along the belt region 9. In this mode, the gate finger electrode 82 extends along the first to fourth side surfaces 5A to 5D and partitions the inside (the cell region 7) of the semiconductor layer 2 from the four directions.

In other words, the gate pad electrode 81 is formed in an annular shape (specifically, a tetragonal annular shape) extending along the outside region 6 in plan view. The gate finger electrode 82 may be formed in a belt shape extending along at least one of the first to fourth side surfaces 5A to 5D and may partition the cell region 7 from at least one direction.

The gate finger electrode 82 faces a part of the SJ region 12, with the intermediate insulating layer 66 therebetween. In other words, the gate finger electrode 82 faces the plurality of first column regions 13 and the plurality of second column regions 14. In addition, the gate finger electrode 82 faces the low resistance region 31, with the intermediate insulating layer 66 therebetween. The gate finger electrode 82 is formed with a space from the channel stop region 32 to the cell region 7 side in plan view. The gate finger electrode 82 may face one or a plurality of FL regions 21, with the intermediate insulating layer 66 therebetween.

The gate finger electrode 82 enters into the first opening 71 from a position on the intermediate insulating layer 66. The gate finger electrode 82 is electrically connected to the gate wiring layer 61 in the first opening 71. A gate signal impressed on the gate pad electrode 81 is directly transmitted to the gate wiring layer 61 and is transmitted to the gate wiring layer 61 through the gate finger electrode 82. As a result, the gate signal is transmitted to the gate electrode 45 through the gate wiring layer 61, and the channel of the SJ-MISFET is subjected to on-off control.

The semiconductor device 1 includes the source pad electrode 83 (the second pad electrode) which is formed on the first main surface 3 in the cell region 7. The source pad electrode 83 functions as an external terminal to which a lead wire (for example, a bonding wire) is to be connected. The source pad electrode 83 is formed on the intermediate insulating layer 66 in a state of being spaced from the gate pad electrode 81 and the gate finger electrode 82.

The source pad electrode 83 covers that region on the intermediate insulating layer 66 which is partitioned by the gate pad electrode 81 and the gate finger electrode 82. In this mode, the source pad electrode 83 has a plan-view shape consistent with the plan-view shape of the cell region 7. In other words, the source pad electrode 83 is formed in a shape in which a part of a side on the first side surface 5A side is recessed toward the second side surface 5B.

The source pad electrode 83 includes a draw-out part 84 drawn out from the cell region 7 into the outside region 6. The draw-out part 84 of the source pad electrode 83 covers the region insulating layer 51, with the intermediate insulating layer 66 therebetween. In addition, the draw-out part 84 of the source pad electrode 83 faces the gate wiring layer 61, with the intermediate insulating layer 66 therebetween.

The source pad electrode 83 enters into the second opening 72 from a position on the intermediate insulating layer 66. The source pad electrode 83 is electrically connected to the low resistance region 31 in the second opening 72. In this mode, the source pad electrode 83 is electrically connected to the second column regions 14, the low resistance region 31, the channel region 41, and the contact region 48 in the second opening 72. In other words, the low resistance region 31 is source grounded and is fixed at a potential equal to that of the second column regions 14 and the like.

In addition, the source pad electrode 83 enters into the third opening 73 from a position on the intermediate insulating layer 66. The source pad electrode 83 is electrically connected to the channel region 41, the source region 46, and the contact region 48 in the third opening 73. A source signal (for example, a reference voltage) impressed on the source pad electrode 83 is transmitted to the second column regions 14, the low resistance region 31, the channel region 41, the source region 46, and the contact region 48.

The semiconductor device 1 includes the equipotential electrode 85 which is formed on the first main surface 3 in the outside region 6. The equipotential electrode 85 is formed on the intermediate insulating layer 66 in a state of being spaced to the first to fourth side surfaces 5A to 5D side from the gate pad electrode 81.

Specifically, the equipotential electrode 85 is formed with a space from the low resistance region 31 to the first to fourth side surfaces 5A to 5D side in plan view. The equipotential electrode 85 is formed in a belt shape extending along the first to fourth side surfaces 5A to 5D. Specifically, the equipotential electrode 85 is formed in an annular shape (in this mode, a tetragonal annular shape) extending along the first to fourth side surfaces 5A to 5D in plan view.

The equipotential electrode 85 enters into the fourth opening 74 and the fifth opening 75 from a position on the intermediate insulating layer 66. The equipotential electrode 85 is electrically connected to the channel stop region 32 in the fourth opening 74. The equipotential electrode 85 is electrically connected to the equipotential wiring layer 65 in the fifth opening 75.

The gate pad electrode 81, the gate finger electrode 82, the source pad electrode 83, and the equipotential electrode 85 each have a stacked structure including a barrier electrode layer 96 and a main body electrode layer 97 stacked in this order from the first main surface 3 side. The barrier electrode layer 96 preferably includes at least one of a Ti layer and a TiN layer. The main body electrode layer 97 has a resistance less than the resistance of the barrier electrode layer 96. The main body electrode layer 97 includes at least one of a pure Al layer, an AlSi alloy layer, an AlCu alloy layer, and an AlSiCu alloy layer. The thickness of the main body electrode layer 97 is in excess of the thickness of the barrier electrode layer 96.

Referring to FIG. 5, the semiconductor device 1 includes a separating insulating layer 91 which is interposed in a region between the region insulating layer 51 and the gate pad electrode 81 and which separates a part of the gate pad electrode 81 from the first main surface 3. The separating insulating layer 91 decreases a capacitance component formed between the gate pad electrode 81 and the semiconductor layer 2 and mitigates an electric field in the outside region 6.

Specifically, the separating insulating layer 91 reduces the capacitance component between the gate pad electrode 81 and the low resistance region 31. In addition, the separating insulating layer 91 reduces a capacitance component between the gate pad electrode 81 and the FL region 21. As a result, undesired electric field concentration due to a current flowing in the low resistance region 31 and the FL region 21 can be restrained, so that voltage endurance can be enhanced.

In this mode, the separating insulating layer 91 is interposed between the intermediate insulating layer 66 and the gate pad electrode 81. That part of the gate pad electrode 81 which is located over the separating insulating layer 91 is located above that part of the gate pad electrode 81 which is located over the intermediate insulating layer 66. In this mode, that part of the gate pad electrode 81 which is in contact with the separating insulating layer 91 is located above that part of the gate pad electrode 81 which is in contact with the intermediate insulating layer 66.

Referring to FIGS. 6 and 7, the separating insulating layer 91, in this mode, is interposed also in a region between the region insulating layer 51 and the gate finger electrode 82. As a result, a part of the gate finger electrode 82 is separated from the first main surface 3 by the separating insulating layer 91. The separating insulating layer 91 decreases a capacitance component formed between the gate finger electrode 82 and the semiconductor layer 2 and mitigates an electric field in the outside region 6.

Referring to FIGS. 5 to 7, the semiconductor device 1 includes a drain pad electrode 92 formed on the second main surface 4 of the semiconductor layer 2. The drain pad electrode 92 forms ohmic contact between itself and the drain region 10. The drain pad electrode 92 may include at least one of a Ti layer, an Ni layer, a Pd layer, an Au layer, an Ag layer, and an Al layer.

The drain pad electrode 92 may have a stacked structure including at least two of a Ti layer, an Ni layer, a Pd layer, an Au layer, an Ag layer, and an Al layer stacked in a freely-selected order. The drain pad electrode 92 preferably includes a Ti layer as an ohmic electrode. The drain pad electrode 92 may have a stacked structure including a Ti layer, an Ni layer, a Pd layer, an Au layer, and an Ag layer stacked in this order from the second main surface 4 side.

Figure 9:
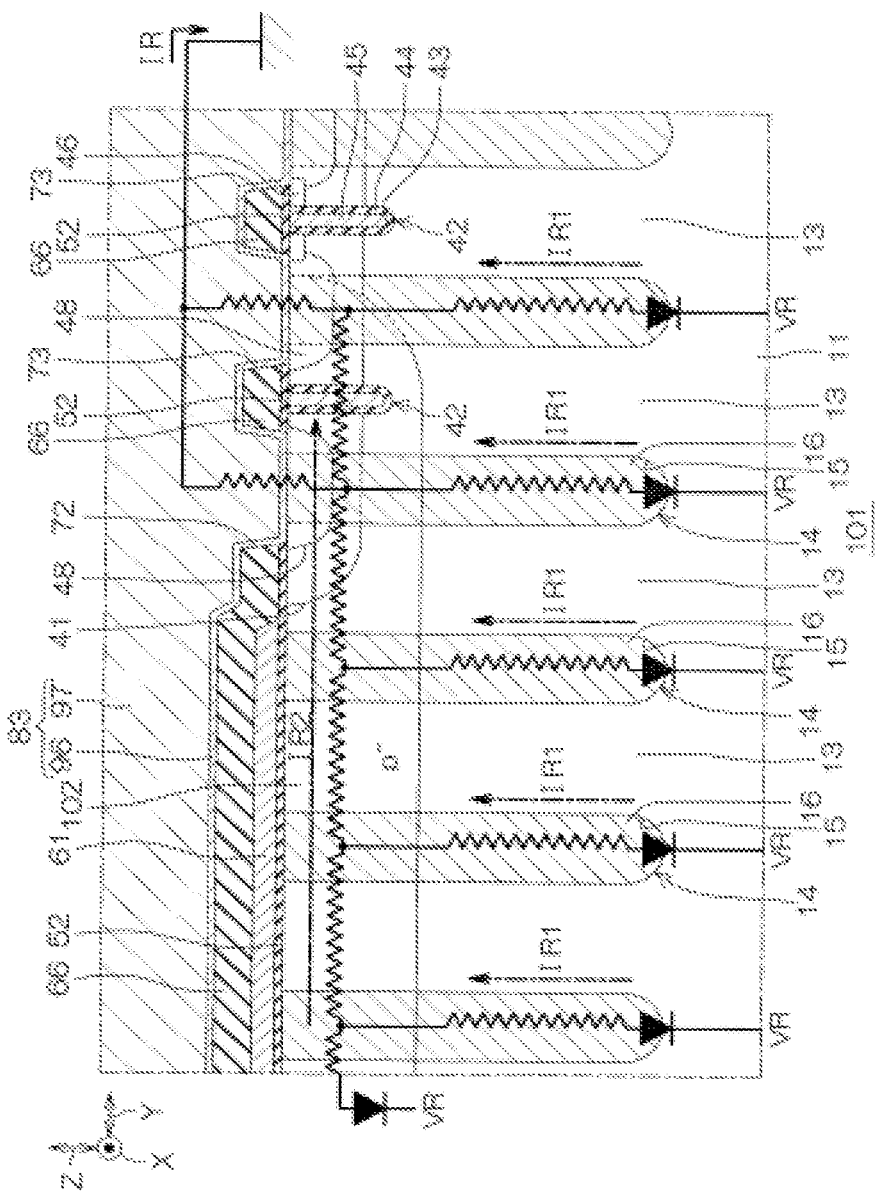
FIG. 9 is a main part enlarged view corresponding to FIG. 8, depicting a semiconductor device according to a comparative example together with an electrical structure.

FIG. 9 is a drawing corresponding to FIG. 8 and is a main part enlarged view depicting a semiconductor device 101 according to a comparative example together with an electrical structure. In FIG. 9, the structures corresponding to those illustrated in FIG. 8 are denoted by the same reference symbols used in FIG. 8, and descriptions thereof are omitted.

Referring to FIG. 9, the semiconductor device 101 according to the comparative example has a high resistance region 102 in place of the low resistance region 31. The high resistance region 102 has a p-type impurity concentration of equal to or less than the p-type impurity concentration of the second column regions 14. Besides, the high resistance region 102 has a p-type impurity concentration of equal to or less than the p-type impurity concentration of the FL region 21.

At the time of a reverse recovery operation of the SJ-MISFET, a reverse bias voltage VR is impressed between the source pad electrode 83 and the drain pad electrode 92, and a reverse recovery current IR flows from the drain pad electrode 92 into the source pad electrode 83. The reverse recovery current IR includes a first reverse recovery current IR1 flowing into the source pad electrode 83 through the plurality of second column regions 14 and a second reverse recovery current IR2 flowing into the source pad electrode 83 side through the low resistance region 31.

Due to the structure in which the high resistance region 102 is shielded by the gate pad electrode 81 (the region insulating layer 51), the second reverse recovery current IR2 is to pass through the high resistance region 102 having a relatively long current path until being discharged to the source pad electrode 83.

As a result, di/dt endurance amount which is a breakdown endurance amount of the semiconductor layer 2 is lowered due to a local temperature rise of in the high resistance region 102 caused by the second reverse recovery current IR2. The local temperature rise in the high resistance region 102 tends to be generated due to the first reverse recovery current IR1 and the second reverse recovery current IR2 at a peripheral edge part of the source pad electrode 83.

In view of this, in the semiconductor device 1, that region of the semiconductor layer 2 which is beneath the gate pad electrode 81 (the region insulating layer 51) is lowered in resistance by the low resistance region 31. The low resistance region 31 has a p-type impurity concentration in excess of the p-type impurity concentration of the second column regions 14. In addition, the low resistance region 31 has a p-type impurity concentration in excess of the p-type impurity concentration of the FL region 21. Besides, the low resistance region 31 is electrically connected to the source pad electrode 83.

As a result, the reverse recovery current IR can be made to flow into the source pad electrode 83 through the low resistance region 31, and, therefore, a temperature rise in that region of the semiconductor layer 2 which is beneath the source pad electrode 81 (the region insulating layer 51) can be restrained. In addition, a local temperature rise at a peripheral edge part of the source pad electrode 83 can be restrained. Consequently, it is possible to provide a semiconductor device 1 in which lowering in the di/dt endurance amount (breakdown endurance amount caused by the reverse recovery current IR) can be restrained.

In addition, the low resistance region 31 has an inner peripheral edge part connected to the second column regions 14. Besides, the source pad electrode 83 is electrically connected to an inner peripheral edge part of the low resistance region 31 and the second column regions 14. As a result, a resistance component in a discharge path for the reverse recovery current IR can be restrained suitably, and, therefore, a local temperature rise can be restrained suitably.

Further, the semiconductor device 1 includes the separating insulating layer 91. The separating insulating layer 91 is interposed in a region between the region insulating layer 51 and the gate pad electrode 81, and separates a part of the gate pad electrode 81 from the first main surface 3. According to the separating insulating layer 91, a capacitance component formed between the gate pad electrode 81 and the semiconductor layer 2 can be reduced, and an electric field in the outside region 6 can be mitigated. As a result, undesired electric field concentration due to a current flowing in the outside region 6 can be restrained, so that voltage endurance can be enhanced.

Figure 10:
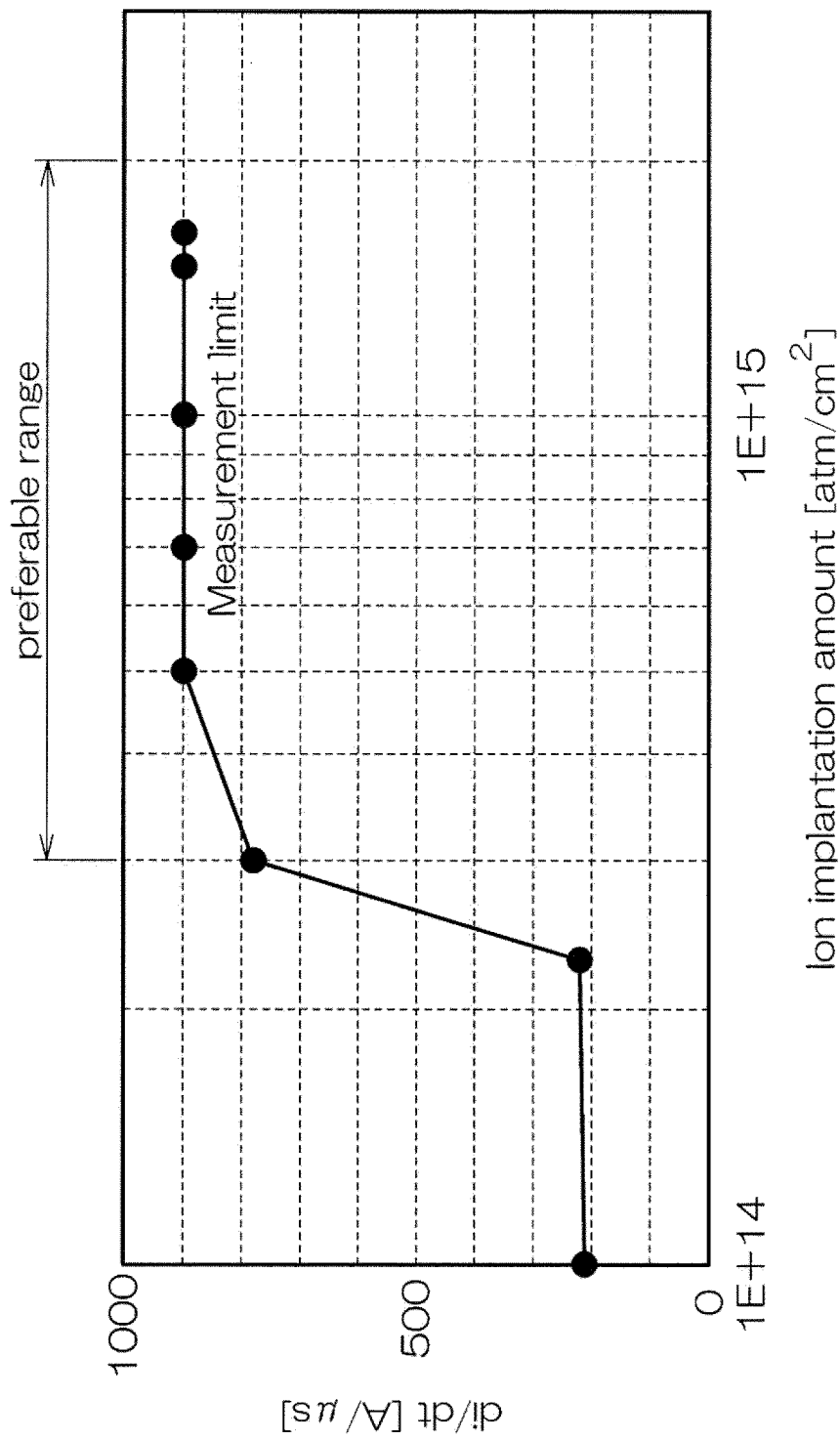
FIG. 10 is a graph depicting the relation between the di/dt endurance amount and the ion implantation amount.

The results of measurement of the relation between an ion implantation amount of the low resistance region 31 and a di/dt endurance amount are depicted in FIG. 10. FIG. 10 is a graph depicting the relation between the di/dt endurance amount and the ion implantation amount. In FIG. 10, the axis of ordinates represents the di/dt endurance amount [A/µs] at the time of a reverse recovery operation, and the axis of abscissas represents the ion implantation amount [cm$^{-2}$] of the low resistance region 31.

Referring to FIG. 10, when the ion implantation amount of the low resistance region 31 was increased from $1\times10^{14}$ cm$^{-2}$ to $2\times10^{15}$ cm$^{-2}$, the di/dt endurance amount was increased from 200 A/µs to 900 A/µs. The di/dt endurance amount was saturated at an ion implantation amount of equal to or more than $5\times10^{14}$ cm$^{-2}$, due to measurement limit.

The low resistance region 31 preferably has an ion implantation amount of more than $1\times10^{14}$ cm$^{-2}$ but no more than $2\times10^{15}$ cm$^{-2}$. This ion implantation amount is converted into a p-type impurity concentration of the low resistance region 31 of more than $2\times10^{16}$ cm$^{-3}$ but no more than $1\times10^{13}$ cm$^{-3}$. It is particularly preferable that the low resistance region 31 has an ion implantation amount of $3\times10^{14}$ cm$^{-2}$ to $2\times10^{15}$ cm$^{-2}$. This ion implantation amount is converted into a p-type impurity concentration of the low resistance region 31 of $2\times10^{17}$ cm$^{-3}$ to $2\times10^{13}$ cm$^{-3}$. According to the low resistance region 31 having this p-type impurity concentration, a relatively high di/dt endurance amount can be realized.

The embodiment of the present disclosure can be carried out further in other modes.

In the abovementioned embodiment, an example in which the second column regions 14 having the trench structure including the column trench 15 and the p-type polysilicon 16 has been described. However, the second column regions 14 may be formed in a column shape by an ion injection method. In addition, the second column regions 14 may be formed in a column shape by a multi-epitaxial growth method in which an ion injection method and an epitaxial growth method are alternately repeated.

In the foregoing embodiment, an example in which the trench gate structure 42 is formed in the cell region 7 has been described. However, a planar gate structure may be formed in place of the trench gate structure 42. In this case, the gate insulating layer 44 covering the first main surface 3 and the gate electrode 45 facing the channel region 41 and the source region 46 with the gate insulating layer 44 therebetween are formed on the first column regions 13.

In the abovementioned embodiment, an example in which the low resistance region 31 is formed ranging over substantially the whole region of the pad region 8 has been described. However, the low resistance region 31 may be formed in a partial region (a region to be lowered in resistance) of the pad region 8. The partial region of the pad region 8 may be, for example, that region of the pad region 8 in which a temperature rise is observed conspicuously in the case where the low resistance region 31 is absent. In addition, the low resistance region 31 may be formed in a belt shape extending along a peripheral edge of the pad region 8.

Besides, in the aforementioned embodiment, a structure in which the conductivity type of each semiconductor part is reversed may be adopted. In other words, the p-type part may be made to be of n-type, and the n-type part may be made to be of p-type.

While the embodiments of the present disclosure have been described in detail, these are merely specific examples used for making clear the technical contents of the present disclosure. The present disclosure is not to be construed as limited to these specific examples, and the scope of the present disclosure is limited only by the appended claims.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device, comprising:
 a semiconductor layer having a main surface;
 a first conductivity type drift region at a surface layer part of the main surface;
 a super junction region having a first conductivity type first column region and a second conductivity type second column region, wherein the first conductivity type first column region and the second conductivity type second column region are in an alternate arrangement at a surface layer part of the first conductivity type drift region;
 a second conductivity type field limit region at the surface layer part of the first conductivity type drift region such as to surround the super junction region in a plan view, wherein the second conductivity type field limit region is shallower than the second conductivity type second column region;
 a second conductivity type low resistance region at the surface layer part of the first conductivity type drift region, wherein the second conductivity type low resistance region has an impurity concentration in excess of an impurity concentration of the second conductivity type second column region;
 a region insulating layer on the main surface, wherein the region insulating layer covers the second conductivity type low resistance region such that a part of the second conductivity type low resistance region is exposed;
 a first pad electrode on the region insulating layer, wherein the first pad electrode overlaps with the second conductivity type low resistance region; and
 a second pad electrode on the main surface, wherein
  the second pad electrode is electrically connected to the second conductivity type second column region and the second conductivity type low resistance region, and
 the first pad electrode is spaced apart from the second pad electrode.

2. The semiconductor device according to claim 1, wherein
 the second conductivity type low resistance region is in a partial region of the super junction region at the surface layer part of the first conductivity type drift region, and
 the first pad electrode is on the region insulating layer such that the first pad electrode overlaps with the super junction region and the second conductivity type low resistance region.

3. The semiconductor device according to claim 1, wherein
 the region insulating layer covers the second conductivity type low resistance region such that a peripheral edge part of the second conductivity type low resistance region is exposed, and
 the second pad electrode is electrically connected to the peripheral edge part of the second conductivity type low resistance region.

4. The semiconductor device according to claim 1, wherein
 the second conductivity type low resistance region has a peripheral edge part connected to the second conductivity type second column region, and
 the second pad electrode is electrically connected to an inner peripheral edge part of the second conductivity type low resistance region and the second conductivity type second column region.

5. The semiconductor device according to claim 1, wherein the second conductivity type low resistance region is shallower than the second conductivity type second column region.

6. The semiconductor device according to claim 1, further comprising a field effect transistor structure that includes a second conductivity type channel region at a surface layer part of the first conductivity type first column region, a gate insulating layer in contact with the second conductivity type channel region, and a gate electrode that faces the second conductivity type channel region, wherein the gate insulating layer is between the gate electrode and the second conductivity type channel region, the first pad electrode is electrically connected to the gate electrode, and the second pad electrode is electrically connected to the second conductivity type channel region.

7. The semiconductor device according to claim 6, wherein the field effect transistor structure is in a region outside of the second conductivity type low resistance region.

8. The semiconductor device according to claim 1, wherein the second conductivity type low resistance region is in a region of the surface layer part of the main surface which is surrounded by the second conductivity type field limit region.

9. The semiconductor device according to claim 1, wherein the second conductivity type low resistance region is spaced apart from the second conductivity type field limit region.

10. The semiconductor device according to claim 1, wherein the second conductivity type low resistance region has the impurity concentration in excess of an impurity concentration of the second conductivity type field limit region.

11. A semiconductor device, comprising:
a semiconductor layer having a main surface;
a first conductivity type drift region at a surface layer part of the main surface;
a super junction region having a first conductivity type first column region and a second conductivity type second column region, wherein the first conductivity type first column region and the second conductivity type second column region are in an alternate arrangement at a surface layer part of the first conductivity type drift region;
a second conductivity type field limit region at the surface layer part of the first conductivity type drift region such as to surround the super junction region in a plan view wherein the second conductivity type field limit region is shallower than the second conductivity type second column region;
a second conductivity type low resistance region in a region surrounded by the second conductivity type field limit region at the surface layer part of the first conductivity type drift region, wherein the second conductivity type low resistance region has an impurity concentration in excess of an impurity concentration of the second conductivity type field limit region;
a region insulating layer on the main surface, wherein the region insulating layer covers the second conductivity type low resistance region such that a part of the second conductivity type low resistance region is exposed;
a first pad electrode on the region insulating layer, wherein the first pad electrode overlaps with the second conductivity type low resistance region; and
a second pad electrode on the main surface, wherein
the second pad electrode is electrically connected to the second conductivity type second column region and the second conductivity type low resistance region, and the first pad electrode is spaced apart from the second pad electrode.

12. The semiconductor device according to claim 11, wherein the second conductivity type low resistance region is spaced apart from the second conductivity type field limit region.

13. The semiconductor device according to claim 11, wherein
the second conductivity type low resistance region is in a partial region of the super junction region at the surface layer part of the first conductivity type drift region, and
the first pad electrode is on the region insulating layer such as to overlap with the super junction region and the second conductivity type low resistance region.

14. The semiconductor device according to claim 11, wherein
the region insulating layer covers the second conductivity type low resistance region such that a peripheral edge part of the second conductivity type low resistance region is exposed, and
the second pad electrode is electrically connected to the peripheral edge part of the second conductivity type low resistance region.

15. The semiconductor device according to claim 11, wherein
the second conductivity type low resistance region has a peripheral edge part connected to the second conductivity type second column region, and
the second pad electrode is electrically connected to the peripheral edge part of the second conductivity type low resistance region and the second conductivity type second column region, at the peripheral edge part of the second conductivity type low resistance region.

16. The semiconductor device according to claim 11, wherein the second conductivity type low resistance region is shallower than the second conductivity type second column region.

17. The semiconductor device according to claim 11, further comprising a field effect transistor structure that includes a second conductivity type channel region at a surface layer part of the first conductivity type first column region, a gate insulating layer in contact with the second conductivity type channel region, and a gate electrode that faces the second conductivity type channel region, wherein the gate insulating layer is between the gate electrode and the second conductivity type channel region, the first pad electrode is electrically connected to the gate electrode, and the second pad electrode is electrically connected to the second conductivity type channel region.

18. A semiconductor device, comprising:
a semiconductor layer having a main surface;
a first conductivity type drift region at a surface layer part of the main surface;
a super junction region having a first conductivity type first column region and a second conductivity type second column region, wherein the first conductivity type first column region and the second conductivity type second column region are in an alternate arrangement at a surface layer part of the first conductivity type drift region;
a second conductivity type low resistance region at the surface layer part of the first conductivity type drift region, wherein the second conductivity type low resistance region has an impurity concentration in excess of an impurity concentration of the second conductivity type second column region;

a region insulating layer on the main surface, wherein the region insulating layer covers the second conductivity type low resistance region such that a part of the second conductivity type low resistance region is exposed;

a first pad electrode on the region insulating layer, wherein the first pad electrode overlaps with the second conductivity type low resistance region;

a second pad electrode on the main surface, wherein the second pad electrode is electrically connected to the second conductivity type second column region and the second conductivity type low resistance region; and a second conductivity type field limit region at the surface layer part of the first conductivity type drift region, wherein
 the second conductivity type field limit region surrounds the super junction region in a plan view, and
 the second conductivity type field limit region is shallower than the second conductivity type second column region.

19. A semiconductor device, comprising:

a semiconductor layer having a main surface;

a first conductivity type drift region at a surface layer part of the main surface;

a super junction region having a first conductivity type first column region and a second conductivity type second column region, wherein the first conductivity type first column region and the second conductivity type second column region are in an alternate arrangement at a surface layer part of the first conductivity type drift region;

a second conductivity type low resistance region at the surface layer part of the first conductivity type drift region, wherein the second conductivity type low resistance region has an impurity concentration in excess of an impurity concentration of the second conductivity type second column region;

a region insulating layer on the main surface, wherein the region insulating layer covers the second conductivity type low resistance region such that a part of the second conductivity type low resistance region is exposed;

a first pad electrode on the region insulating layer, wherein the first pad electrode overlaps with the second conductivity type low resistance region;

a second pad electrode on the main surface, wherein the second pad electrode is electrically connected to the second conductivity type second column region and the second conductivity type low resistance region; and a field effect transistor structure that includes:
 a second conductivity type channel region at a surface layer part of the first conductivity type first column region;
 a gate insulating layer in contact with the second conductivity type channel region; and
 a gate electrode that faces the second conductivity type channel region, wherein
  the gate insulating layer is between the gate electrode and the second conductivity type channel region,
  the first pad electrode is electrically connected to the gate electrode,
  the second pad electrode is electrically connected to the second conductivity type channel region, and
  the field effect transistor structure is in a region outside of the second conductivity type low resistance region.

\* \* \* \* \*